(12) United States Patent
Kim et al.

(10) Patent No.: US 6,790,800 B2
(45) Date of Patent: Sep. 14, 2004

(54) MICROWAVE DIELECTRIC CERAMIC COMPOSITION HAVING HIGH QUALITY FACTOR

(75) Inventors: Hyun-Jai Kim, Seoul (KR); Seok-Jin Yoon, Seoul (KR); Ji-Won Choi, Seoul (KR); Chong-Yun Kang, Seoul (KR); Jong-Yoon Ha, Seongnam-si (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/325,777

(22) Filed: Dec. 19, 2002

(65) Prior Publication Data
US 2003/0216244 A1 Nov. 20, 2003

(30) Foreign Application Priority Data
May 20, 2002 (KR) .......................................... 2002-27735

(51) Int. Cl.⁷ ............................................. C04B 35/495
(52) U.S. Cl. ......................................................... 501/135
(58) Field of Search ..................................... 501/32, 135

(56) References Cited

U.S. PATENT DOCUMENTS 5,756,412 A * 5/1998 Lee et al. .................... 501/135
5,985,781 A * 11/1999 Lee et al. .................... 501/135

FOREIGN PATENT DOCUMENTS

JP           404299302       * 10/1992

* cited by examiner

Primary Examiner—Karl Group
(74) Attorney, Agent, or Firm—Jones Day

(57) ABSTRACT

Disclosed is a dielectric ceramic composition represented by $(1-x)(Mg_{1/3}Ta_{2/3})O_2-xZrO_2(0<x\leq 0.2)$ that has high dielectric constants, high quality factor (Q) values, and stable temperature coefficients of the resonant frequency. The composition can easily achieve a high quality factor (Q) value by sintering for a lesser duration and at lower temperatures.

1 Claim, No Drawings

MICROWAVE DIELECTRIC CERAMIC COMPOSITION HAVING HIGH QUALITY FACTOR

FIELD OF THE INVENTION

The present invention relates to a dielectric ceramic composition for high frequency with high dielectric constants, high quality factor (Q) values, and stable temperature coefficients in the resonant frequencies.

More specifically, the present invention relates to a dielectric ceramic composition for high frequency that can easily obtain a high quality factor (Q) value by sintering for a shorter time at a lower temperature.

BACKGROUND OF THE INVENTION

There have been recent remarkable developments in communication systems that use microwave frequencies with a range of 300 MHz to 300 GHz in mobile communications such as wireless telephone sets and car-phones, satellite broadcastings, satellite communications and the like. For the practical use of such new media, dielectric ceramics for high frequency are now increasingly applied to resonators, band pass (or stop) filters, duplexers and microwave integration circuit (MIC) and the like.

High dielectric constant and high frequency are required for miniaturization of parts because the wavelength of microwaves within dielectric ceramics is inversely proportional to the square root of a dielectric constant, and the frequency. Generally, a dielectric constant ($\in_r$) is inversely proportional to a quality factor (Q) value, and as the frequency in use is increased to $\geq 2$ GHz, the parts are sufficiently miniaturized. Thus, dielectric ceramics materials having high quality factor rather than large dielectric constant, and which have excellent selectivity and band width are required. Dielectric ceramics materials having dielectric constant of 90 are used in cellular phone filters of 800 MHz bandwith and those having dielectric constant of 38 are used in PCS phone filters of 1.9 GHz bandwith. As the high frequency may be used in WLL (Wireless Local Loop), IMT 2000 (International Mobile Telecommunication for the 2000s), UMTS (Universal Mobile Telecommunication System) and the like in the future, the materials having high quality factor and dielectric constant of 20 will be utilized and are now actively applied to a variety of resonators, filters for base stations, antennae and the like.

The representative examples of dielectric ceramics materials having high Q values, which have been developed, include $MgTiO_3$—$CaTiO_3$ type, of which the Q·$f_0$ value is 56,000 GHz, the dielectric constant is 21, the temperature coefficient of resonant frequency is 0 ppm/° C., and the sintering temperature is about 1,400° C. [See, K. Wakino, Ferroelectrics, 91, 69 (1989)]. The ceramics materials having the Q·$f_0$ value of 56,000 GHz can be applied to some parts for the mobile communications but have some problems in the frequency selectivity to be used as the materials for 3rd generation mobile communications of 3–4 GHz. Therefore, a material having higher Q value is needed.

Another dielectric ceramics materials having high Q value are $Ba(Zn,Ta)O_3$ type, of which the Q·$f_0$ value is 150,000 GHz, the dielectric constant is 30, the temperature coefficient of resonant frequency is 1 ppm/° C., and the sintering temperature is about 1,600° C. [See, S. B. Desu. J. Am. Ceram. Soc., 68, 546 (1985)]. The composition has a high Q value but has problems of very high sintering temperature and to obtain the high Q value, and it is necessary to achieve an ordering of the B site by heat treating for the long time ($\geq 10$ hours) in high temperature.

SUMMARY OF THE INVENTION

The object of the present invention is to provide solutions to the aforementioned problems in the art and provide a dielectric ceramic composition for microwave frequency that have a high quality factor (Q) value without any necessity for achieving an ordering of the B site by heat treating for lengthy times in high temperature, and has a high Q·$f_0$ value, a high dielectric constant and a stable temperature coefficient of resonant frequency.

DETAILED DESCRIPTION OF THE PRESENT INVENTION

The present invention provides a dielectric ceramic composition for high frequency with high dielectric constants, high quality factor (Q) values, and good temperature coefficients in the resonant frequencies.

More specifically, the present invention provides a dielectric ceramic composition for high frequency that can easily obtain a high quality factor (Q) value by sintering for a shorter time at a lower temperature.

The object of the invention is achieved by providing a dielectric ceramic composition represented by the following formula 1:

$$(1-x)(Mg_{1/3}Ta_{2/3})O_2-xZrO_2 \qquad (1)$$

wherein x is molar ratio and $0<x\leq 0.2$.

The dielectric ceramic composition according to the present invention has dielectric constants of 21.4 to 28.9; a Q·$f_0$ value of 65,000 to 180,400 GHz; a temperature coefficient of resonant frequency (TCF; $\tau_f$) of −58.5 to +53.1 ppm/° C., which can be controlled to 0 ppm/° C. with change of the constitution; and can be used as ceramics material, which is applied to dielectric ceramics parts for microwave frequency.

The properties of the composition for microwave frequency according to the present invention vary depending on the constitution ratio of $(Mg_{1/3}Ta_{2/3})O_2$ and $ZrO_2$.

For example, in sintering for 3 hours at a temperature of 1,450° C., as the molar fraction of $ZrO_2$ is increased from 1 mole % to 20 mole %, the dielectric constants are gradually decreased from 27.9 to 21.4. When the molar fraction of $ZrO_2$ is 0 mole %, the Q·$f_0$ values are 65,000 GHz. When that of $ZrO_2$ is 1 mole %, the Q·$f_0$ values are greatly increased to 166,600 GHz and thereafter as the molar fraction of $ZrO_2$ is increased from 1 mole % to 20 mole %, the values are gradually decreased to 130,000 GHz. Also, as the molar fraction of $ZrO_2$ is increased, the temperature coefficient of resonant frequency is decreased from 50.6 to −56.0 ppm/° C. in a linear mode, by which the temperature coefficient of resonant frequency may be controlled.

Furthermore, in sintering for 3 hours at a temperature of 1,500° C., as the molar fraction of $ZrO_2$ is increased from 1 mole % to 8 mole %, the dielectric constants are gradually decreased from 28.9 to 24.1. When the molar fraction of $ZrO_2$ is 0 mole %, the Q·$f_0$ values are 95,400 GHz. When that of $ZrO_2$ is 1 mole %, the Q·$f_0$ values are greatly increased to 180,400 GHz and thereafter as the molar fraction of $ZrO_2$ is increased from 1 mole % to 8 mole %, the values are gradually decreased to 124,700 GHz. Also, as the molar fraction of $ZrO_2$ is increased, the temperature coefficient of resonant frequency is decreased from 50.1 to −21.7 ppm/° C. in a linear mode so that the temperature coefficient of resonant frequency may be easily controlled.

In particular, when the composition, in which $ZrO_2$ is contained in the amount of 6.5 mole %, is sintered for 3 hours at 1,450° C., an excellent dielectric ceramics composition for microwave frequency may be prepared wherein the dielectric constants are 25.7, the $Q \cdot f_0$ values are 143,000 GHz, and the temperature coefficient of resonant frequency is 0 ppm/° C.

The present invention is explained in detail with the examples given below. However, the examples presented here are for illustrative purposes only and should not be construed as limiting the invention.

EXAMPLE

MgO having purity of 98%, $Ta_2O_5$ and $ZrO_2$ having purity of 99% were weighed in a constitution ratio (x, mole ratio) indicated in Table 1, and mixed. The mixtures were calcined for 4 hours at a temperature of 1,200° C., and then milled. Subsequently, aqueous PVA (polyvinyl alcohol) solutions were added as forming additives. The mixtures were pressed into cylinder-type specimens having a diameter of 10 mm and a thickness of 5 to 6 mm. The cylinder-type specimens were heated for 1 hour at a temperature of 600° C. to remove organic binders and then sintered for 3 hours at a temperature of 1,450° C. and 1,500° C. in air, respectively.

Both sides of the sintered specimens were thoroughly polished with abrasive paper (SiC paper) and introduced into a waveguide. Dielectric constants, Q values and temperature coefficients of the resonant frequency of the specimens were measured at a frequency range of 8.5~9.8 GHz and temperature range of 20~80° C., according to a dielectric resonator method known well to those skilled in the art. The microwave dielectric properties of each specimen are shown in Table 1.

TABLE 1

High Frequency Dielectric Properties of $(1 - x)(Mg_{1/3}Ta_{2/3})O_2 - xZrO_2$

| Sample No. | Constitution x (mole) | Sintering Temperature (° C.)/ time (hr) | Dielectric constant ($\epsilon_r$) | $Q \cdot f_0$ (GHz) | $\tau_f$ (ppm/° C.) |
|---|---|---|---|---|---|
| 1 | 0.000 | 1450° C./3 hr | 26.3 | 65000 | 53.1 |
| 2 | 0.010 | | 27.9 | 166600 | 50.6 |

TABLE 1-continued

High Frequency Dielectric Properties of $(1 - x)(Mg_{1/3}Ta_{2/3})O_2 - xZrO_2$

| Sample No. | Constitution x (mole) | Sintering Temperature (° C.)/ time (hr) | Dielectric constant ($\epsilon_r$) | $Q \cdot f_0$ (GHz) | $\tau_f$ (ppm/° C.) |
|---|---|---|---|---|---|
| 3 | 0.050 | | 26.8 | 144300 | 26.9 |
| 4 | 0.060 | | 26.2 | 143500 | 7.0 |
| 5 | 0.065 | | 25.7 | 143000 | 0 |
| 6 | 0.070 | | 25.1 | 140800 | −8.6 |
| 7 | 0.080 | | 24.1 | 140000 | −22.3 |
| 8 | 0.100 | | 22.3 | 133100 | −56.0 |
| 9 | 0.200 | | 21.4 | 130000 | −58.5 |
| 10 | 0.000 | 1500° C./3 hr | 27.1 | 95400 | 51.0 |
| 11 | 0.010 | | 28.9 | 180400 | 50.1 |
| 12 | 0.050 | | 27.6 | 148000 | 25.4 |
| 13 | 0.060 | | 26.5 | 137700 | 6.3 |
| 14 | 0.065 | | 25.9 | 135000 | 0 |
| 15 | 0.070 | | 25.1 | 130200 | −7.2 |
| 16 | 0.080 | | 24.1 | 124700 | −21.7 |

The present invention can provide a dielectric ceramic composition for microwave frequency that has high dielectric constants applicable to the relevant parts and stable temperature coefficients of the resonant frequency, and which can easily obtain a high quality factor (Q) value ($\geq 140,000$ GHz) by sintering for a shorter time at a lower temperature without carrying out heat treatment for lengthy periods at high temperature ($\geq 1,550°$ C.) required in the conventional art, to achieve an ordering of the B site. Therefore, the dielectric ceramic composition for microwave frequency of the present invention has excellent characteristics required for resonators, filters for base stations, antennae and circuit boards of commonly used cellular and PCS phones in the range of 800 MHz~1.9 GHz, and of IMT 2000 of 2GHz and UMTS of 3~4 GHz, which will be used hereafter.

What is claimed is:

1. A dielectric ceramic composition for high frequency represented by the following formula 1:

$$(1-x)(Mg_{1/3}Ta_{2/3})O_2\text{-}xZrO_2 \qquad (1)$$

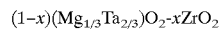

wherein x is molar ratio and $0 < x \leq 0.2$.

* * * * *